(12) United States Patent
Huang et al.

(10) Patent No.: US 10,302,459 B2
(45) Date of Patent: May 28, 2019

(54) BEND SENSOR

(71) Applicant: TAIWAN ALPHA ELECTRONIC CO., LTD., Taoyuan (TW)

(72) Inventors: Tzu-Hsuan Huang, Taoyuan (TW); Wei-Liang Liu, Taoyuan (TW); Huang-Chao Chan, Taoyuan (TW)

(73) Assignee: TAIWAN ALPHA ELECTRONIC CO., LTD., Taoyuan (TW)

( * ) Notice: Subject to any disclaimer, the term of this patent is extended or adjusted under 35 U.S.C. 154(b) by 0 days.

(21) Appl. No.: 15/707,260

(22) Filed: Sep. 18, 2017

(65) Prior Publication Data

US 2018/0113003 A1    Apr. 26, 2018

(30) Foreign Application Priority Data

Oct. 21, 2016  (TW) .............................. 105134038 A

(51) Int. Cl.
| | |
|---|---|
| *H05K 1/02* | (2006.01) |
| *H05K 1/11* | (2006.01) |
| *G01D 5/16* | (2006.01) |
| *G01B 7/16* | (2006.01) |

(52) U.S. Cl.
CPC ................. *G01D 5/16* (2013.01); *G01B 7/20* (2013.01); *H05K 1/028* (2013.01); *H05K 1/111* (2013.01); *H05K 2201/10151* (2013.01)

(58) Field of Classification Search
CPC ............ G01R 19/0092; G01R 19/0084; G01R 19/00; G01R 19/165; G01R 21/00; G01B 7/18; G01B 7/20; G01D 5/16

USPC ....................................................... 324/76.11
See application file for complete search history.

(56) References Cited

U.S. PATENT DOCUMENTS

| | | | | |
|---|---|---|---|---|
| 3,124,769 A | * | 3/1964 | Peterson | G01L 1/2287 338/2 |
| 3,991,745 A | * | 11/1976 | Yoslow | A61B 5/103 600/594 |
| 4,484,026 A | * | 11/1984 | Thornburg | G06F 3/045 178/18.05 |

(Continued)

FOREIGN PATENT DOCUMENTS

| | | |
|---|---|---|
| TW | M513404 U | 12/2015 |
| TW | 201635105 | 10/2016 |

*Primary Examiner* — Christopher P McAndrew
(74) *Attorney, Agent, or Firm* — Muncy, Geissler, Olds & Lowe, P.C.

(57) ABSTRACT

A bend sensor includes a flexible circuit substrate, an insulation pad and a flexible conductive substrate. The flexible circuit substrate includes an insulating body, a first circuit and a second circuit. The first and second circuits are disposed on opposing sides of the insulating body. The first circuit has first fingers, while the second circuit has second fingers. The insulation pad disposed on the insulating body exposes the first and second fingers. The flexible conductive substrate disposed on the insulation pad has a conductive layer separated from the first fingers and the second fingers. While the bend sensor is bent, the conductive layer on the flexible conductive substrate would deform toward the flexible circuit substrate so as to form multiple contacts with the first and second fingers. Through these contacts, a number of resistors are formed to contribute a detectable resistance for the corresponding bending amplitude to be further realized.

7 Claims, 18 Drawing Sheets

(56) References Cited

U.S. PATENT DOCUMENTS

| | | | | |
|---|---|---|---|---|
| 4,492,949 A * | 1/1985 | Peterson | ............... | B25J 13/084 338/114 |
| 4,765,422 A * | 8/1988 | Hoffmann | ............ | G01G 3/1402 177/211 |
| 4,857,887 A * | 8/1989 | Iten | ................... | H03K 17/9643 341/34 |
| 4,931,782 A * | 6/1990 | Jackson | ................ | G06F 3/0414 178/18.01 |
| 5,086,785 A * | 2/1992 | Gentile | ................ | A61B 5/1126 338/210 |
| 5,157,372 A * | 10/1992 | Langford | ................. | G01B 7/18 338/211 |
| 5,162,775 A * | 11/1992 | Kuramochi | ............... | G01L 1/20 338/114 |
| 5,309,135 A * | 5/1994 | Langford | ................. | B60Q 5/00 280/728.3 |
| 5,610,528 A * | 3/1997 | Neely | .................. | A61B 5/1071 324/660 |
| 5,625,333 A * | 4/1997 | Clark | .................... | B60Q 5/003 280/731 |
| 5,828,289 A * | 10/1998 | Burgess | ................. | H01H 1/029 338/47 |
| 5,847,639 A * | 12/1998 | Yaniger | ..................... | G01L 1/20 338/99 |
| 5,948,990 A * | 9/1999 | Hashida | .................... | G01L 1/20 338/114 |
| 6,043,587 A * | 3/2000 | Jaenker | ............... | H01L 41/0926 310/328 |
| 6,236,301 B1* | 5/2001 | Langford | ............... | B60Q 5/003 338/2 |
| 6,404,107 B1* | 6/2002 | Lazarus | .............. | G03F 7/70725 310/328 |
| 6,450,046 B1* | 9/2002 | Maeda | .................... | B60N 2/002 73/862.451 |
| 6,629,341 B2* | 10/2003 | Wilkie | ................. | H01L 41/082 29/25.35 |
| 6,701,296 B1* | 3/2004 | Kramer | ................ | A61B 5/6806 370/545 |
| 6,781,285 B1* | 8/2004 | Lazarus | ................ | F16F 15/005 310/332 |
| 6,909,354 B2* | 6/2005 | Baker | ....................... | G01L 1/20 338/114 |
| 6,964,205 B2* | 11/2005 | Papakostas | .............. | G01L 1/20 73/862.046 |
| 7,068,142 B2* | 6/2006 | Watanabe | ............ | H01C 10/106 338/114 |
| 7,112,755 B2* | 9/2006 | Kitano | ...................... | G01L 1/20 200/17 R |
| 7,277,004 B2* | 10/2007 | Beck | ...................... | H01C 10/16 324/660 |
| 7,646,135 B1* | 1/2010 | Churchill | .............. | H01L 41/113 310/313 R |
| 8,047,083 B2* | 11/2011 | Puzio | ....................... | B25F 5/02 73/862.21 |
| 8,256,123 B2* | 9/2012 | Lee | ......................... | G06F 3/014 33/1 N |
| 8,547,197 B2* | 10/2013 | Byun | ..................... | H01C 10/10 338/2 |
| 8,619,054 B2* | 12/2013 | Philipp | ............. | G01R 27/2605 345/174 |
| 8,890,649 B2* | 11/2014 | Saitou | ...................... | G01B 7/18 252/511 |
| 8,931,351 B2* | 1/2015 | Muramatsu | .............. | G01B 1/00 73/849 |
| 9,195,067 B1* | 11/2015 | Heinrich | ................ | G06F 3/0346 |
| 2005/0052412 A1* | 3/2005 | McRae | ................... | A63F 13/06 345/158 |
| 2006/0076852 A1* | 4/2006 | Ruile | ................ | H03H 9/02228 310/313 R |
| 2006/0213278 A1* | 9/2006 | Arms | ...................... | G01B 7/16 73/781 |
| 2008/0233822 A1* | 9/2008 | Swallow | .............. | D03D 1/0088 442/185 |
| 2010/0220074 A1* | 9/2010 | Irvin, Jr. | ................. | G06F 3/045 345/174 |
| 2010/0259503 A1* | 10/2010 | Yanase | .................. | G06F 3/0416 345/174 |
| 2011/0221564 A1* | 9/2011 | Deppiesse | .......... | H03K 17/9625 338/99 |
| 2011/0226066 A1* | 9/2011 | Anand | ..................... | G01B 7/18 73/777 |
| 2013/0234734 A1* | 9/2013 | Iida | ........................ | G06F 3/044 324/661 |
| 2014/0035603 A1* | 2/2014 | Ray | ........................ | G01L 1/205 324/693 |
| 2014/0192027 A1* | 7/2014 | Ksondzyk | ............. | G01N 27/22 345/178 |
| 2015/0263698 A1* | 9/2015 | Tanaka | ............... | H03H 9/02622 310/313 C |
| 2015/0369678 A1* | 12/2015 | Yoshida | .................... | G01L 3/10 73/862.325 |
| 2016/0162022 A1* | 6/2016 | Seth | ........................ | G06F 3/017 345/156 |
| 2017/0048965 A1* | 2/2017 | Cho | ......................... | H05K 1/02 |
| 2017/0176167 A1* | 6/2017 | Keller | ...................... | G01B 7/18 |
| 2017/0219331 A1* | 8/2017 | Pegan | .................. | G01L 1/2287 |
| 2017/0231811 A1* | 8/2017 | Cubon | ...................... | A61F 7/02 607/110 |
| 2018/0044554 A1* | 2/2018 | Kigami | ..................... | B32B 7/06 |

\* cited by examiner

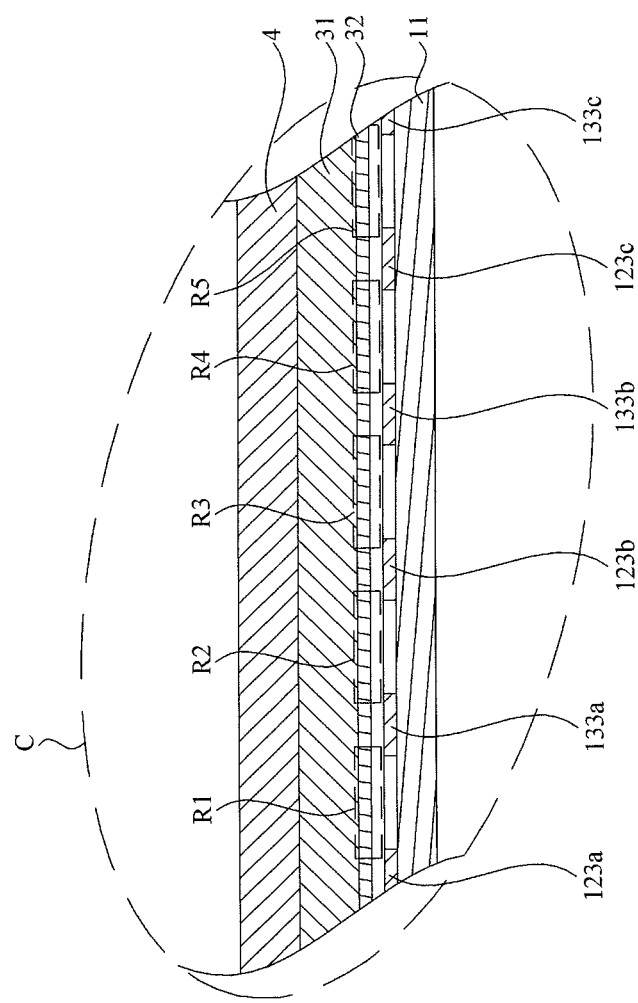

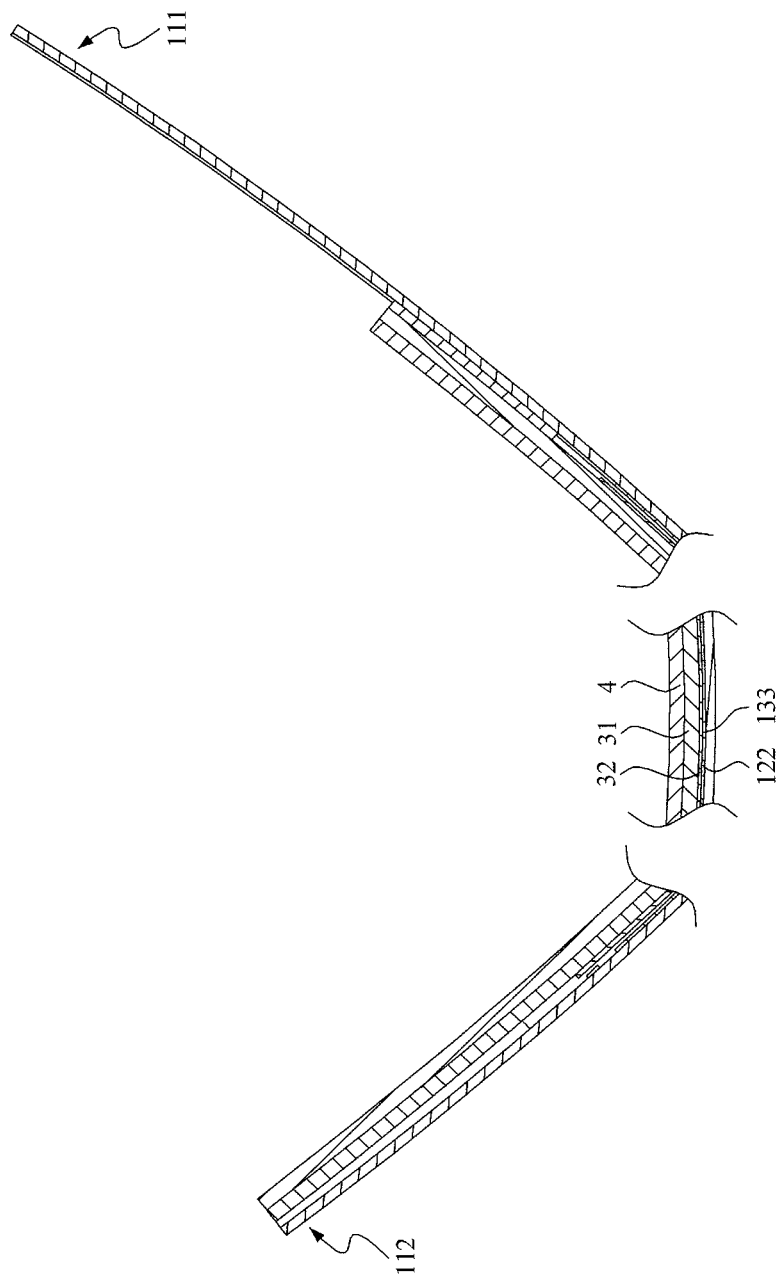

BEND SENSOR

BACKGROUND OF THE INVENTION

1. Field of the Invention

The invention relates to a bend sensor, and more particularly to the bend sensor that is applied to detect bending amplitudes.

2. Description of the Prior Art

Referring now to FIG. 1, a schematically perspective view of a conventional bend sensor is shown. This conventional bend sensor PA100 includes a circuit substrate PA1, a conductive circuit PA2 and a resistance-varying layer PA3. The conductive circuit PA2 and the resistance-varying layer PA3 are both disposed on the circuit substrate PA1, and the conductive circuit PA2 is electrically coupled with one end of the resistance-varying layer PA3. The resistance-varying layer PA3 is formed by alternately arranging conductive sections PA31 and resistor sections PA32. Thereupon, when the bend sensor PA100 is bent, a deformation in a form of extension of the resistor section PA32 would vary significantly the resistance, and the consequent change in the resistance would be implemented to detect the amplitude corresponding to the bending.

SUMMARY OF THE INVENTION

In view of the conventional bend sensor, bending thereto would deform the resistor sections thereof so as to expand the transmission path of electric current but to reduce the cross-sectional area for flowing the electric current, such that the corresponding resistance would be varied, and further by which the exact bending quantity of the bend sensor can be realized. However, since the resistance of the bend sensor is varied through deforming the resistor sections, thus detecting of the bend sensor is strictly limited to specific bending patterns. Namely, it is highly possible that the bend sensor can only detect deformations in a unique direction. Accordingly, it is an object of the present invention to provide a bend sensor that can detect the bending amplitude of bend sensor by realizing the electric conductivity thereof. Thereupon, the shortcoming in unidirectional detection at the conventional bend sensor can be effectively resolved.

In the present invention, the bend sensor includes a flexible circuit substrate, an insulation pad and a flexible conductive substrate.

The flexible circuit substrate includes an insulating body, a first circuit and a second circuit. The insulating body is extended in a first direction.

The first circuit, disposed on the insulating body, includes a first bus portion and a plurality of first fingers. The first bus portion, located at one side of the insulating body, extends in the first direction. The plurality of first fingers extends from the first bus portion in a second direction different from the first direction.

The second circuit, disposed on the insulating body, includes a second bus portion and a plurality of second fingers. The second bus portion, disposed at another side of the insulating body by opposing to the first bus portion, extends in the first direction. The plurality of second fingers extend from the second bus portion in a reverse direction of the second direction, and are alternately arranged with the plurality of first fingers.

The insulation pad, disposed onto the insulating body, is furnished with a central hollow portion for exposing therefrom the plurality of first fingers and the plurality of second fingers.

The flexible conductive substrate, adhered to the insulation pad to sandwich the insulation pad in between with the flexible circuit substrate so as to form a central empty space at the central hollow portion, is furnished with a conductive layer exposed to the central empty space and facing the plurality of first fingers and the plurality of second fingers.

When the bend sensor is bent at both ends thereof to produce a bending deformation in the first direction, a total contact number of the plurality of first fingers and the plurality of second fingers with the conductive layer would be varied according to a change in the bending deformation of the bend sensor, such that an equivalent resistance between the first circuit and the second circuit would vary accordingly, and the bending deformation can thus be realized by detecting the equivalent resistance value.

In one embodiment of the present invention, this second direction is perpendicular to the first direction.

In one embodiment of the present invention, the insulating body has a first end and a second end, in which the first end extends to the second end in the first direction. Preferably, the first circuit further includes a first transmission portion, the second circuit further includes a second transmission portion, the first transmission portion is formed by extending from the first bus portion to the first end, and the second transmission portion is formed by extending from the second bus portion to the first end.

In one embodiment of the present invention, the insulation pad includes a first lateral-side supportive portion, a second lateral-side supportive portion and an end supportive portion. The first lateral-side supportive portion, disposed at one side of the insulating body, is located between the insulating body and the flexible conductive substrate. The second lateral-side supportive portion, disposed at another side of the insulating body by opposing to the first lateral-side supportive portion, is located between the insulating body and the flexible conductive substrate. The end supportive portion, disposed at one end of the insulating body, is integrated as a unique piece with the first lateral-side supportive portion and the second lateral-side supportive portion, such that the first lateral-side supportive portion, the second lateral-side supportive portion and the end supportive portion are integrated to form thereinside the central hollow portion.

The first lateral-side supportive portion further has a first end supportive portion, the second lateral-side supportive portion further has a second end supportive portion, and an aperture for communicating spatially the central empty space with the atmosphere is formed between the first end supportive portion and the second end supportive portion at another end of the insulating body by opposing to the end supportive portion.

In one embodiment of the present invention, the bend sensor further includes a reinforcing plate adhered to the flexible conductive substrate.

As stated above, since the bend sensor of the present invention is to dispose the first circuit and the second circuit on the same flexible circuit substrate and to introduce an insulation pad to separate the flexible circuit substrate from and flexible conductive substrate, thus, when the bend sensor is bent, a bending deformation would be produced to contact and thus connect electrically the flexible circuit substrate and the flexible conductive substrate through the central hollow portion of the insulation pad. In addition, since the bending amplitude of the bend sensor in accordance with the present invention is determined by judging the contact area, thus bi-directional bending detection can be performed effectively.

All these objects are achieved by the bend sensor described below.

BRIEF DESCRIPTION OF THE DRAWINGS

The present invention will now be specified with reference to its preferred embodiment illustrated in the drawings, in which:

FIG. 6A is an enlarged view of area C of FIG. 6;

FIG. 14 is a schematically cross-sectional view of the bend sensor of FIG. 4 under another major bending moment applied through the first end and the second end of the bend sensor to generate a large-scale concave deformation thereof, viewing from line A-A of FIG. 4.

DESCRIPTION OF THE PREFERRED EMBODIMENT

The invention disclosed herein is directed to a bend sensor. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
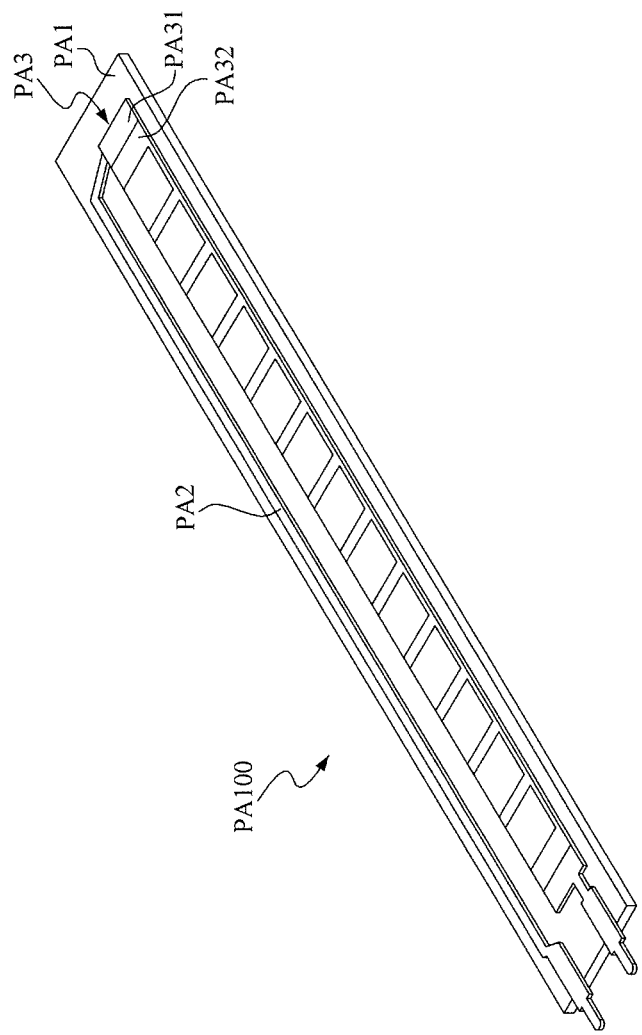
FIG. 1 is a schematically perspective view of a conventional bend sensor.
Figure 2:
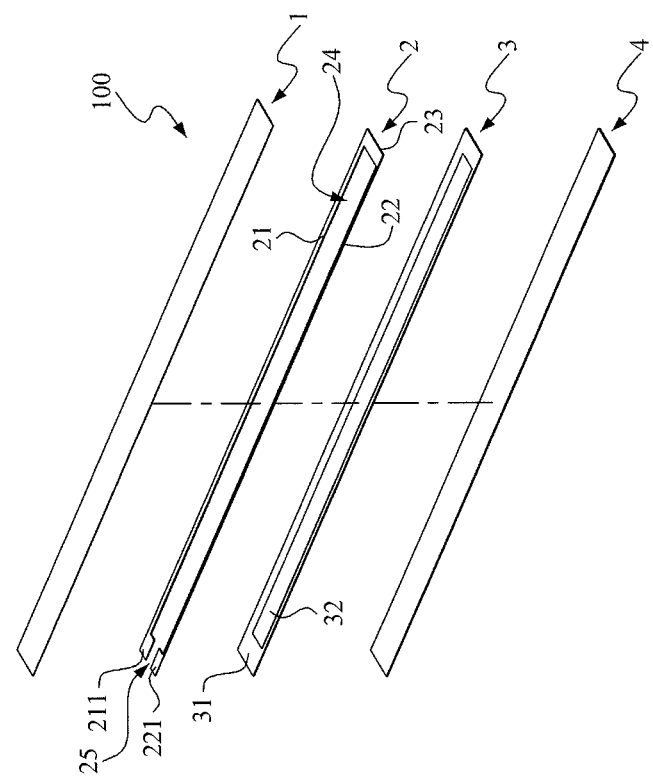
FIG. 2 is a schematically exploded view of a preferred embodiment of the bend sensor in accordance with the present invention.
Figure 3:
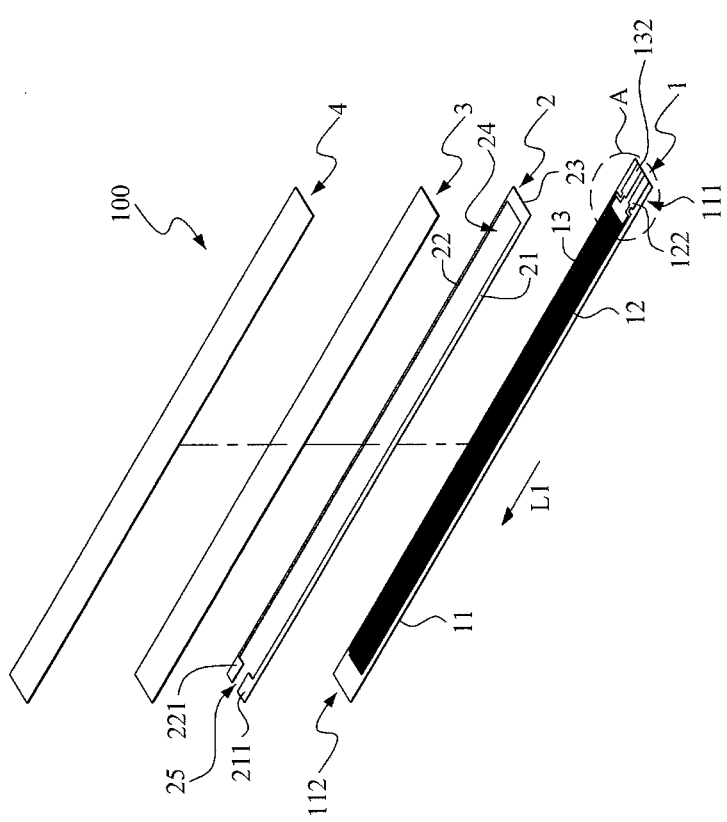
FIG. 3 is another view of FIG. 2.
Figure 3A:
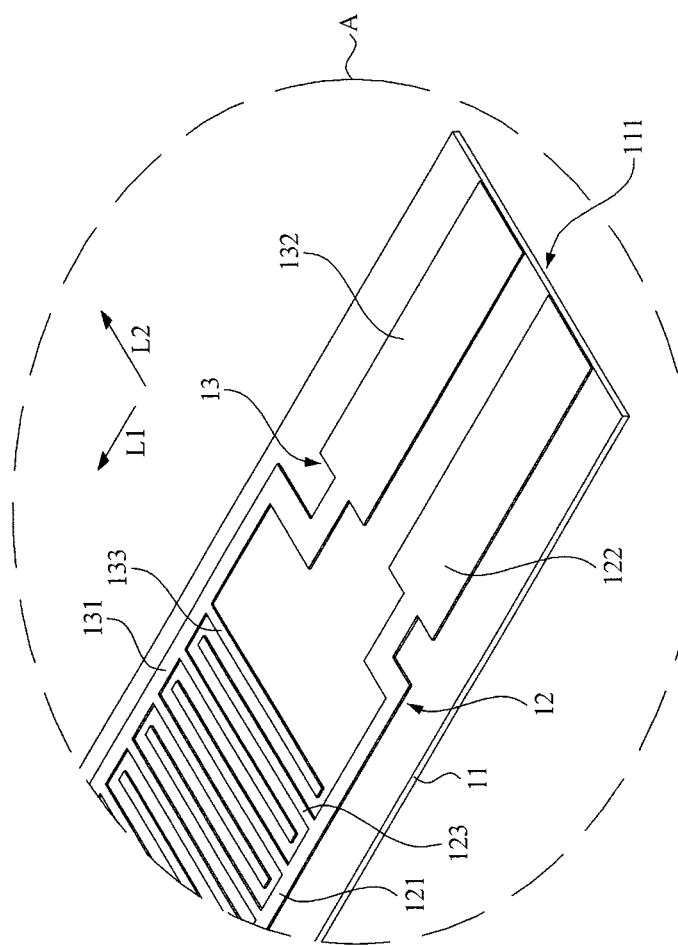
FIG. 3A is an enlarged view of area A of FIG. 3.

Refer now to FIG. 2 through FIG. 3A; where FIG. 2 is a schematically exploded view of a preferred embodiment of the bend sensor in accordance with the present invention, FIG. 3 is another view of FIG. 2, and FIG. 3A is an enlarged view of area A of FIG. 3. As shown, the bend sensor 100 includes a flexible circuit substrate 1, an insulation pad 2, a flexible conductive substrate 3 and a reinforcing plate 4.

The flexible circuit substrate 1 includes an insulating body 11, a first circuit 12 and a second circuit 13. The insulating body 11 has a first end 111 and a second end 112, in which the first end 111 extends to the second end 112 in a first direction L1.

The first circuit 12 disposed on the insulating body 11 includes a first bus portion 121, a first transmission portion 122 and a plurality of first fingers 123 (one labeled in the figure). The first bus portion 121 disposed at a side of the insulating body 11 extends in the first direction L1. The first transmission portion 122 is formed by extending from the first bus portion 121 to the first end 111. The plurality of first fingers 123 extend from the first bus portion 121 in a second direction L2 perpendicular to the first direction L1.

The second circuit 13 disposed also on the insulating body 11 includes a second bus portion 131, a second transmission portion 132 and a plurality of second fingers 133 (one labeled in the figure). The second bus portion 131, disposed at another side of the insulating body 11 by opposing to the side disposing the first bus portion 121, extends in the first direction L1. The second transmission portion 132 is formed by extending from the second bus portion 131 to the first end 111. The plurality of second fingers 133 extend from the second bus portion 131 in a reverse direction of the second direction L2, and the first fingers 123 and the second fingers 133 are alternately arranged. Practically, the first circuit 12 and the second circuit 13 are both conductive pastes, such as a silver paint.

Figure 4:
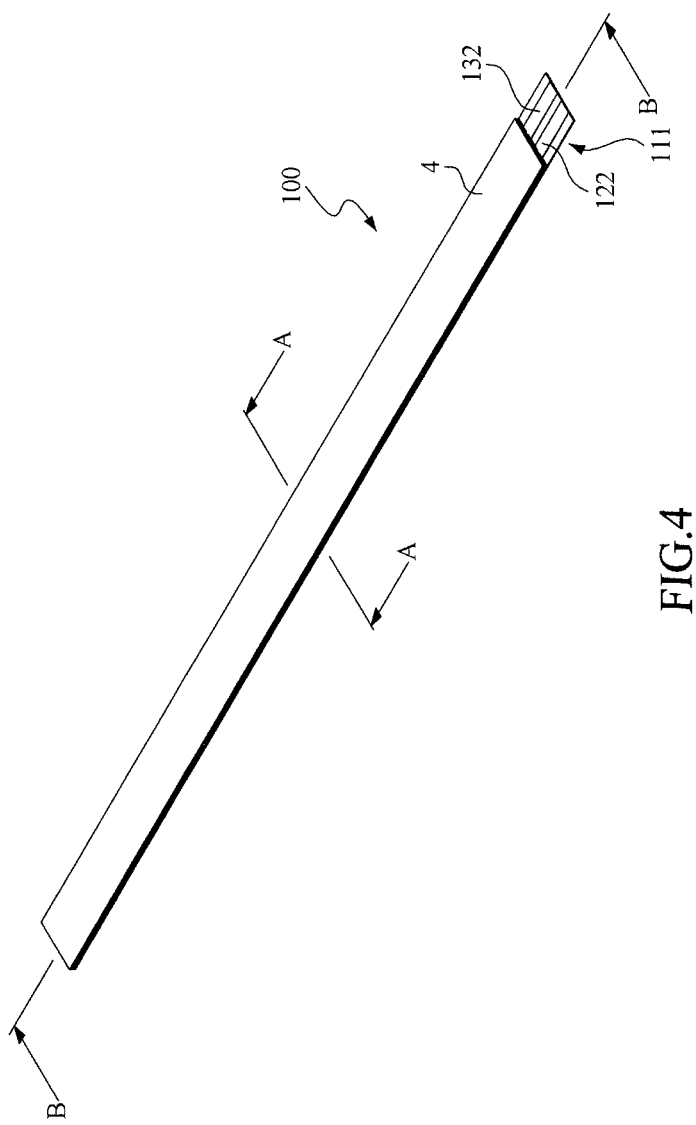
FIG. 4 is a perspective view of FIG. 2.
Figure 5:
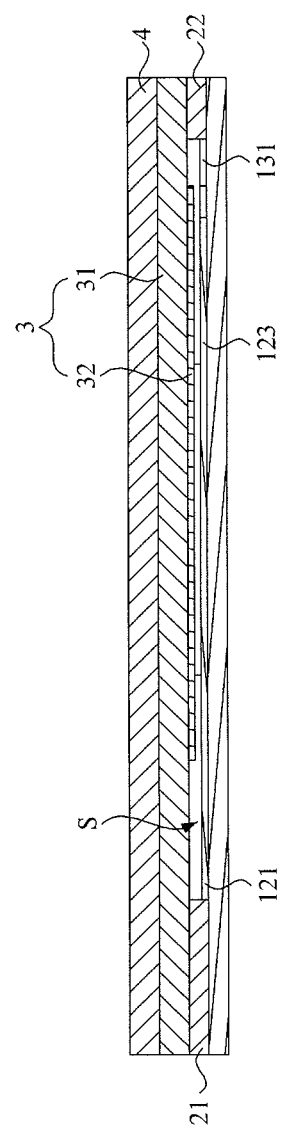
FIG. 5 is a schematically cross-sectional view of FIG. 4 along line A-A.
Figure 6:
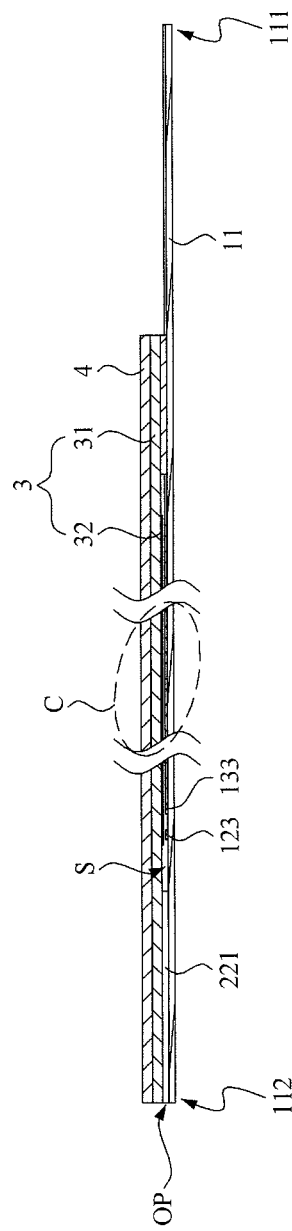
FIG. 6 is a schematically cross-sectional view of FIG. 4 along line B-B.

Refer now to FIG. 3 through FIG. 6; where FIG. 4 is a perspective view of FIG. 2, FIG. 5 is a schematically cross-sectional view of FIG. 4 along line A-A, and FIG. 6 is a schematically cross-sectional view of FIG. 4 along line B-B. As shown, the insulation pad 2 includes a first lateral-side supportive portion 21, a second lateral-side supportive portion 22 and an end supportive portion 23. The first lateral-side supportive portion 21 is disposed at a side of insulating body 11 that is furnished with the first circuit 12. The second lateral-side supportive portion 22 is disposed at another side of the insulating body 11 by opposing to the first lateral-side supportive portion 21. The end supportive portion 23 is disposed at the first end 111, and is integrated as a unique piece with the first lateral-side supportive portion 21 and the second lateral-side supportive portion 22, such that the first lateral-side supportive portion 21, the second lateral-side supportive portion 22 and the end supportive portion 23 can be structured integrally to form thereinside a central hollow portion 24 for exposing therefrom the first fingers 123 and the second fingers 133. In this embodiment, the first lateral-side supportive portion 21 further has a first end supportive portion 211 extending to the second end 112, and the second lateral-side supportive portion 22 further has a second end supportive portion 221 extending to the second end 112. With the first end supportive portion 211 and the second end supportive portion 221, an aperture 25 is formed in between thereof at the second end 112 for communicating spatially the central hollow portion 24 with the atmosphere. In addition, in this embodiment, the insulation pad 2 is a pad made of an insulating resin.

The flexible conductive substrate 3 includes an insulation substrate 31 and a conductive layer 32. The insulation substrate 31, adhered onto and completely covering the insulation pad 2, integrates the flexible circuit substrate 1 to sandwich the insulation pad 2 in between so as to somehow seal the central hollow portion 24 to produce a central empty space S for the bend sensor, but to leave an exhaust pathway OP formed by the aperture 24 to connect spatially the central empty space S with the atmosphere. The conductive layer 32 disposed on the insulation substrate 31 is to face the flexible circuit substrate 1 in a manner of exposing the conductive layer 32 to the central empty space S but being separated from the first fingers 123 and the second fingers 133 by predetermined spacing. In this embodiment, the insulation substrate 31 made of an insulating resin is a flexible plastic substrate, and the conductive layer 32 is formed by coating a carbon paint on the insulation substrate 31.

The reinforcing plate 4 is adhered onto another face of the insulation substrate 31 of the flexible conductive substrate 3 by opposing to the conductive layer 32, so that the entire rigidity or elasticity of the bend sensor 100 would be increased through the integration of the reinforcing plate 4 and the flexible conductive substrate 3.

Figure 7:
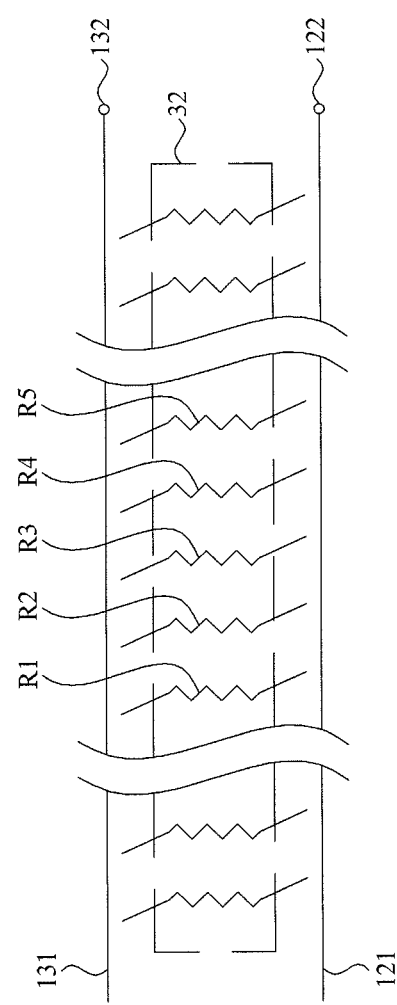
FIG. 7 is a schematic view of an equivalent circuit with respect to FIG. 6.

Refer now to FIG. 6A and FIG. 7; where FIG. 6A is an enlarged view of area C of FIG. 6, and FIG. 7 is a schematic view of an equivalent circuit with respect to FIG. 6. As shown, three said first fingers 123a, 123b and 123c, out of the plurality of first fingers 123, and three said second fingers 133a, 133b and 133c, out of the plurality of second fingers 133, are shown to be alternately arranged. When the conductive layer 32 is deformed to contact these three first fingers 123a, 123b and 123c and these three second fingers 133a, 133b and 133c, a first resistor R1, a second resistor R2, a third resistor R3, a fourth resistor R4 and a fifth resistor R5 in a parallel arrangement would be formed between the first finger 123a and the second finger 133a, between the second finger 133a and the first finger 123b, between the first finger 123b and the second finger 133b, between the second finger 133b and the first finger 123c, and between the first finger 123c and the second finger 133c, respectively. However, as shown in FIG. 5, while the bend sensor 100 is free of bending at the first end 111 and the second end 112, since no bending deformation exists, the conductive layer 32 would be free of contact with the first fingers 123 and the second fingers 133. In this state, the first resistor R1, the second resistor R2, the third resistor R3, the fourth resistor R4 and the fifth resistor R5 between the first circuit 12 and the second circuit 13 would not exist any more, and thus can be deemed as open circuits.

Figure 8:
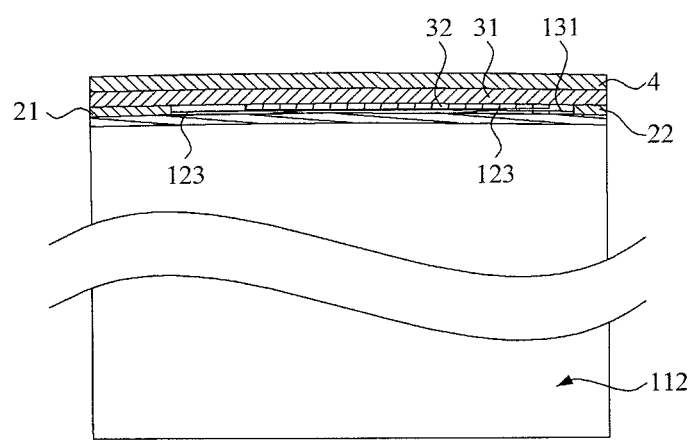
FIG. 8 is a schematically cross-sectional view of the bend sensor of FIG. 4 under a minor bending moment applied through a first end and a second end of the bend sensor to generate a slight convex deformation thereof, viewing from line A-A of FIG. 4.
Figure 9:
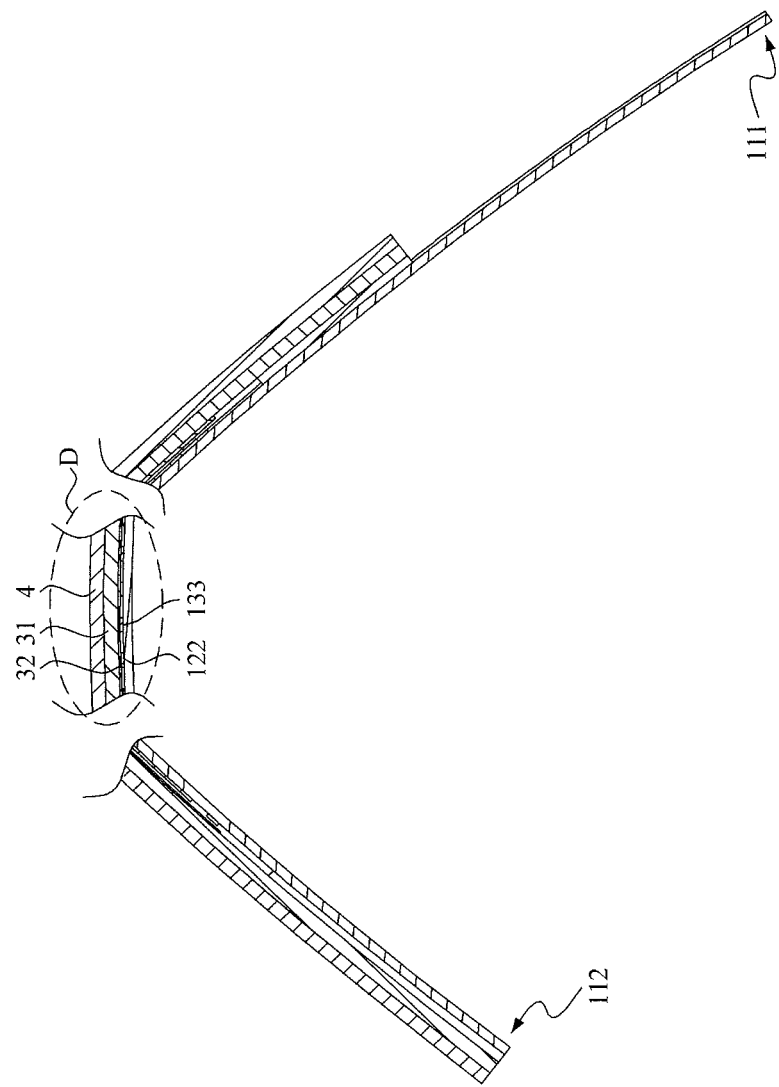
FIG. 9 is another schematically cross-sectional view of the bend sensor of FIG. 8 but viewing from line B-B of FIG. 4.

Refer now to FIG. 8 and FIG. 9; where FIG. 8 is a schematically cross-sectional view of the bend sensor of FIG. 4 under a minor bending moment applied through a first end and a second end of the bend sensor to generate a slight convex deformation thereof, viewing from line A-A of FIG. 4, and FIG. 9 is another schematically cross-sectional view of the bend sensor of FIG. 8 but viewing from line B-B of FIG. 4. As shown, when the first end 111 and the second end 112 is bent to generate a slight convex deformation, since the bending would produce the largest stress and strain at a center point of the bend sensor 100, thus the insulating body 11 and the insulation substrate 31 would be bent to enter the central empty space S, such that all the first fingers 123, the second fingers 133 and the conductive layer 32 around the center point of the bend sensor 100 would be deemed as being squeezed toward the central empty space S so as further to have the conductive layer 32 to contact and conduct with the first fingers 123 and the second fingers 133.

As shown in FIG. 9, since the first end 111 and the second end 112 are forced to have the bend sensor 100 to experience only minor bending and thus a slight deformation, hence only the first fingers 123, the second fingers 133 and the conductive layer 32 located around the center point of the bend sensor 100 would engage to conduct. On the other hand, those first fingers 123, second fingers 133 and conductive layer 32 located close to either end 111, 112 of the bend sensor 100 would be kept at a separate state (or a non-contact state). In addition, while the bend sensor 100 is forced to bend, although the flexible circuit substrate 1, the insulating pad 2, the flexible conductive substrate 3 and the reinforcing plate 4 are deformed to squeeze the central empty space S, due at this time that the central empty space S connected with the atmosphere is able to expel the internal air freely via the exhaust pathway OP, thus the entire bend sensor 100 won't be exploded by a possible high air pressure inside the squeezed central empty space S.

Figure 9A:
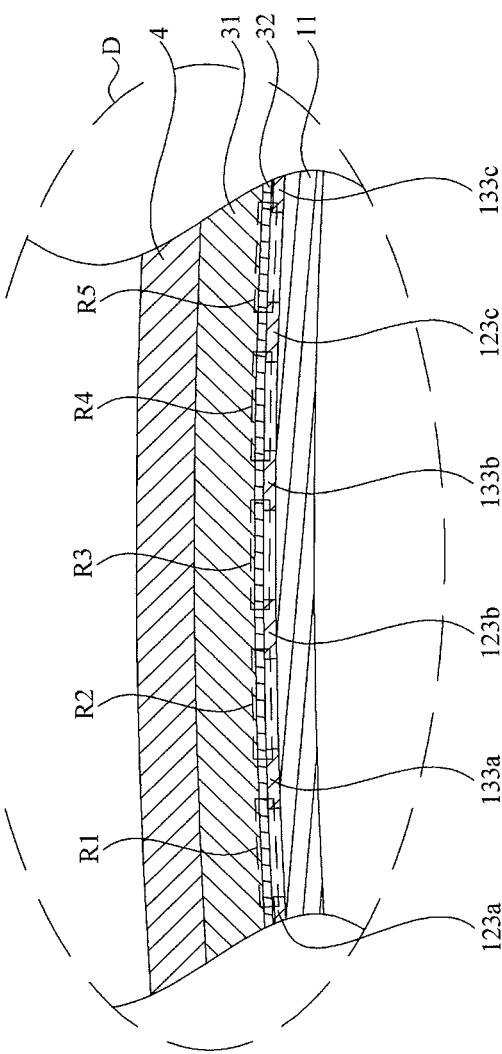
FIG. 9A is an enlarged view of area D of FIG. 9.
Figure 10:
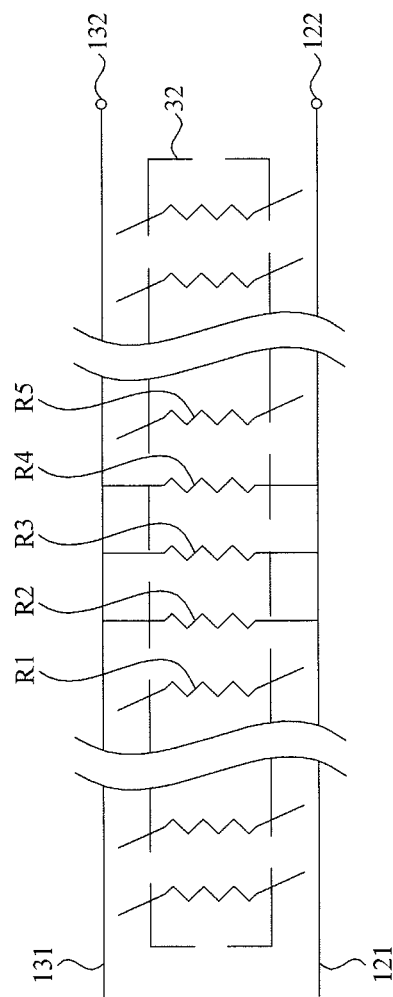
FIG. 10 is a schematic view of an equivalent circuit with respect to FIG. 9.

Refer now to FIG. 9A and FIG. 10; where FIG. 9A is an enlarged view of area D of FIG. 9, and FIG. 10 is a schematic view of an equivalent circuit with respect to FIG. 9. As shown, since the first end 111 and the second end 112 of the bend sensor 100 are forced simultaneously to convex-deform slightly, then the conductive layer 32 would be squeezed to protrude and thus contact the first fingers 123b, 123c and the second fingers 133a, 133b, such that the conductive layer 32 would bridge electrically to connect the second finger 133a to the first finger 123b, the first finger 123b to the second finger 133b, and the second finger 133b to the first finger 123c. Thereupon, a second resistor R2 is formed between the second finger 133a and the first finger 123b, a third resistor R3 is fainted between the first finger 123b and the second finger 133b, and a fourth resistor R4 is formed between the second finger 133b and the first finger 123c. Since the conductive layer 32 does not contact the first finger 123a and the second finger 133c, thus a first resistor R1 between the first finger 123a and the second finger 133a wouldn't be formed. Similarly, a fifth resistor R5 between the first finger 123c and the second finger 133c wouldn't be formed, either. At this time, the total resistance between the first circuit 12 and the second circuit 13 would be equal to (R2×R3×R4)/(R2+R3+R4). In the aforesaid description, the phrase that a resistor is formed implies that the related circuit through this resistor is close and thus conducted. On the other hand, the phrase that a resistor is not formed implies that the related circuit through this resistor is open.

Figure 11:
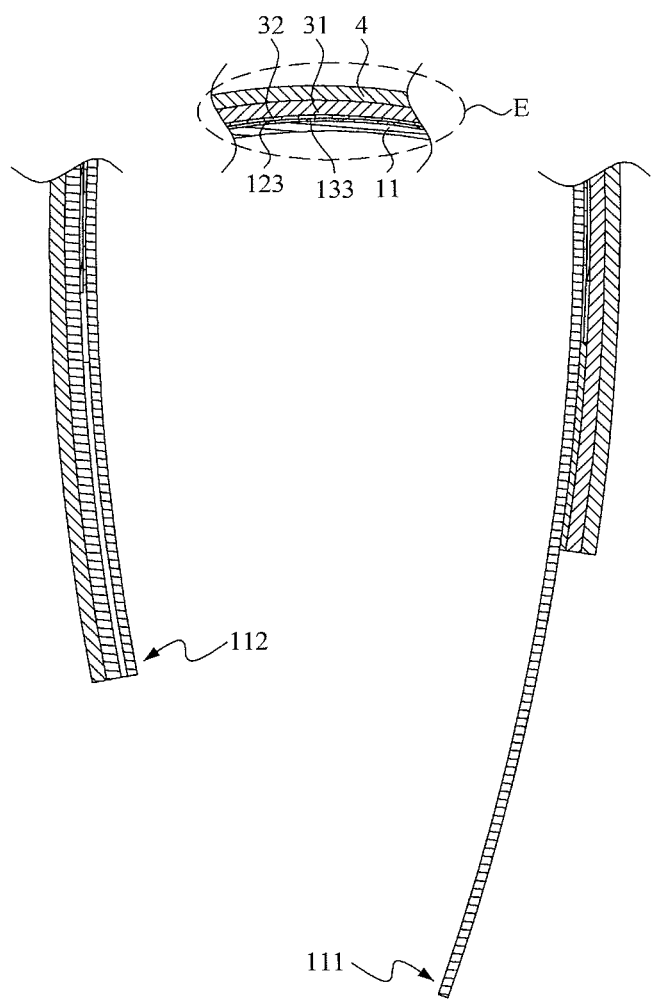
FIG. 11 is a schematically cross-sectional view of the bend sensor of FIG. 4 under a major bending moment applied through the first end and the second end of the bend sensor to generate a large-scale convex deformation thereof, viewing from line A-A of FIG. 4.

Referring now to FIG. 11, a schematically cross-sectional view of the bend sensor of FIG. 4 under a major bending moment applied through the first end and the second end of the bend sensor to generate a large-scale convex deformation thereof, viewing from line A-A of FIG. 4 is shown. As illustrated, when the first end 111 and the second end 112 of the bend sensor 100 are forced simultaneously to convex-deform significantly, then, except for the first fingers 123 and the second fingers 133 around the center point of the bend sensor 100 able to contact the conductive layer 32, the other first fingers 123 and the second fingers 133 close to the two ends of the bend sensor 100 would contact and thus conduct via the conductive layer 32.

Figure 11A:
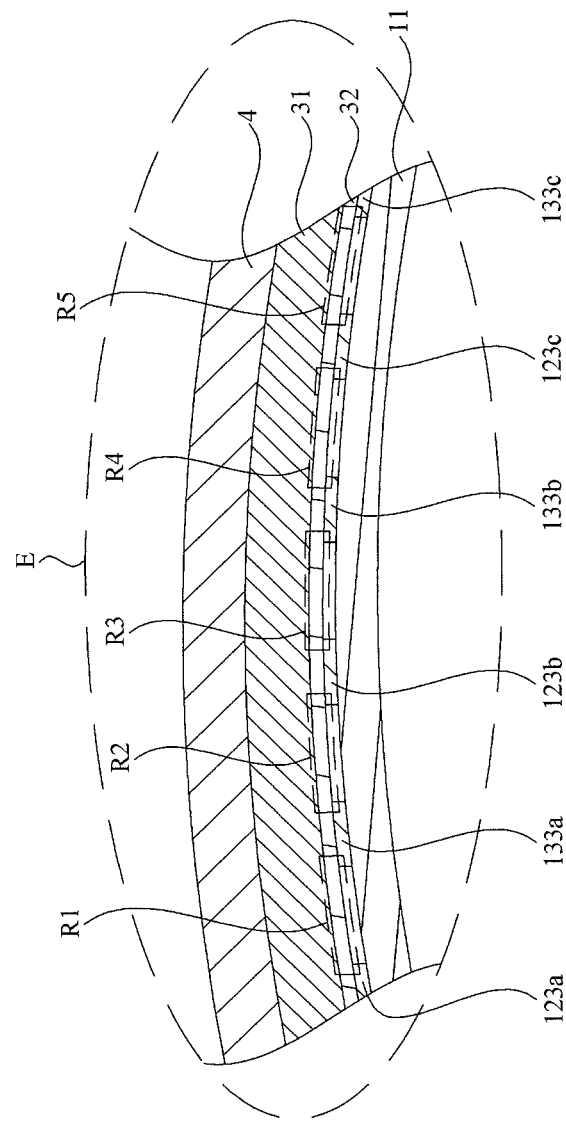
FIG. 11A is an enlarged view of area E of FIG. 11.
Figure 12:
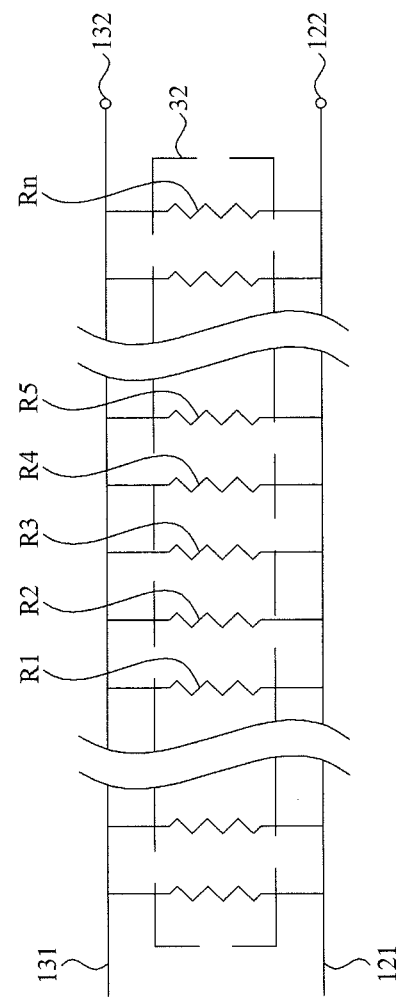
FIG. 12 is a schematic view of an equivalent circuit with respect to FIG. 11.

Refer now to FIG. 11A and FIG. 12; where FIG. 11A is an enlarged view of area E of FIG. 11, and FIG. 12 is a schematic view of an equivalent circuit with respect to FIG. 11. As shown, since the first end 111 and the second end 112 of the bend sensor 100 are forced simultaneously to concave-deform significantly, thus the contacts of the conductive layer 32 between the first circuit 12 and the second circuit 13 would form a plurality of resistors including a first resistor R1, a second resistor R2, a third resistor R3, a fourth resistor R4, a fifth resistor R5 . . . and an n-th resistor Rn.

At this time, the total resistance between the first circuit 12 and the second circuit 13 would be equal to (R1×R2×R3×R4×R5× . . . ×Rn)/(R1+R2+R3+R4+R5+ . . . +Rn).

As described above, since the contact number of the first fingers 123 and the second fingers 133 via the conductive layer 32 would be affected by the magnitude of the bending deformation of the bend sensor 100 while the two opposing ends of the bend sensor 100 in the first direction L1 are forced and bent, thereby the resistance between the first circuit 12 and the second circuit 13 would be variable. In this embodiment, an increase in the contact number would decrease the total resistance. In the present invention, the bending deformation can be quantified by a curvature, an angular displacement or a displacement deformation.

As stated above, since a resistor would be generated between the first finger 123 and the neighboring second finger 133 through the contact conduction provided by the conductive layer 32, thus, as the contact number of the first fingers 123 and the second fingers 133 with the conductive layer 32 is increased due to an increase in the bending deformation of the bend sensor 100, more resistors in parallel between the first circuit 12 and the second circuit 13 would be formed due to more and more contact involvement of the first fingers 123 and the second fingers 133 with the conductive layer 32. Thereupon, the total resistance between the first circuit 12 and the second circuit 13 would be reduced. Namely, the total resistance between the first circuit 12 and the second circuit 13 would be decreased as the bending deformation of the bend sensor 100 is increased. At the same time, the voltage detected across the first circuit 12 and the second circuit 13 would decrease as the bending deformation of the bend sensor 100 increases.

Figure 13:
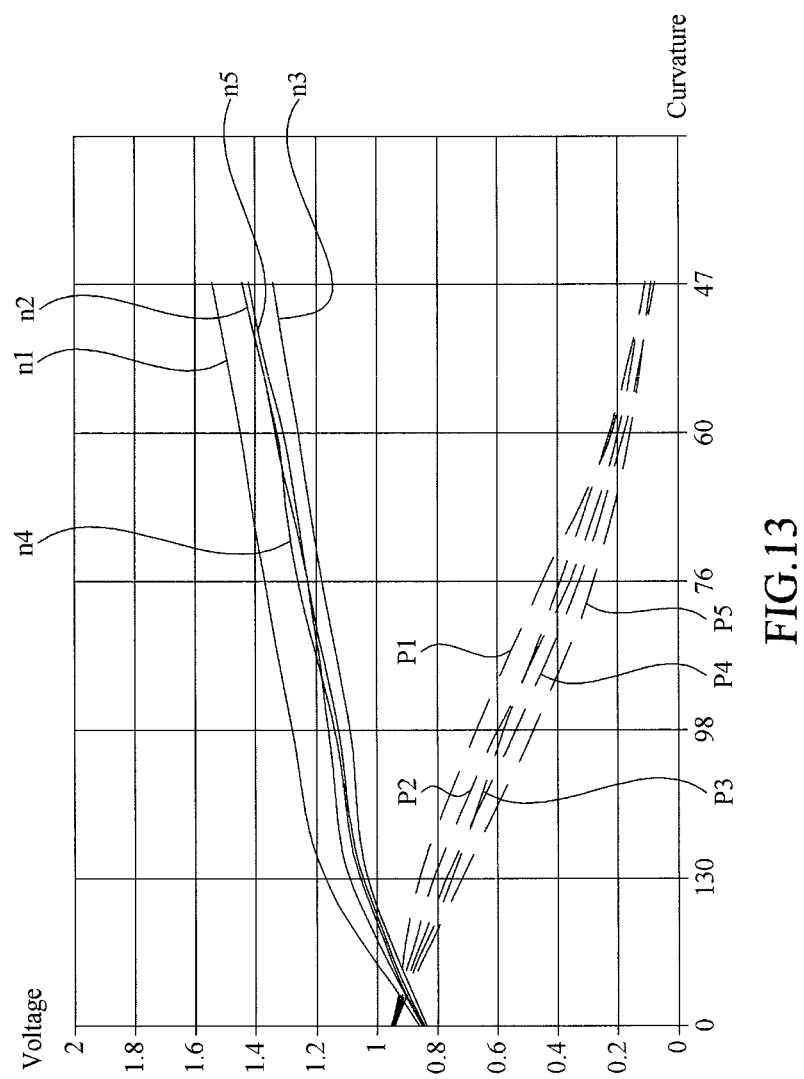
FIG. 13 is a plot of voltages to curvature for both the bend sensor of the present invention and the conventional bend sensor.

Referring now to FIG. 13, a plot of voltages to curvature for both the bend sensor of the present invention and the conventional bend sensor is shown. As illustrated, curves P1, P2, P3, P4 and P5 demonstrate corresponding voltage variations for the bend sensor 100 of the present invention adhered to different cylindrical surfaces with diameters of 130 mm, 98 mm, 76 mm, 60 mm and 47 mm, respectively. On the other hand, curves n1, n2, n3, n4 and n5 demonstrate corresponding voltage variations for the conventional bend sensor adhered to different cylindrical surfaces with the diameters of 130 mm, 98 mm, 76 mm, 60 mm and 47 mm, respectively. Since a smaller diameter of the cylinder would render a smaller perimeter of the cylinder, thus, when the bend sensor 100 of the present invention is adhered to the cylindrical surface of a 130 mm-diameter cylinder, a smaller bending deformation would be generated. On the other hand, when the bend sensor 100 of the present invention is adhered to the cylindrical surface of a 47 mm-diameter cylinder, a larger bending deformation would be generated. In the present invention, the bend sensor 100 would gradually lower the total resistance of the valid resistors formed between the first circuit 12 and the second circuit 13 via the conduction served by the deformed conductive layer 32, as the bending deformation increases. Hence, the voltage detected by the bend sensor 100 would decrease with the diameter of the respective cylinder.

Nevertheless, since the resistance of the conventional bend sensor PA100 increases with the bending deformation, thus the voltage detected by the conventional bend sensor 100 would increase as the diameter of the respective cylinder decreases.

In addition, since the bend sensor 100 of the present invention would reduce the equivalent resistance value as the bending deformation increases, thus, in comparison with the conventional bend sensor PA100 that can only increase the resistance linearly by increasing the deformation of the conductive layer, the bend sensor 100 of the present invention can provide a wider detection range, and increase relative detection sensitivity.

Referring now to FIG. 14, a schematically cross-sectional view of the bend sensor of FIG. 4 under another major bending moment applied through the first end and the second end of the bend sensor to generate a large-scale concave deformation thereof, viewing from line A-A of FIG. 4, is shown. As illustrated, when the bend sensor 100 of the present invention is forced simultaneously at both ends to concave-deform, then electric connection between the first circuit 12 and the second circuit 13 is established by having the conductive layer 32 to deform and make contacts with the first fingers 123 and the second fingers 133. Namely, the bend sensor 100 of the present invention can perform bending detection bi-directionally.

In summary, in comparison with the conventional bend sensor whose resistance is varied by deforming the resistor section, and thus by which the detectable bending direction is limited; the bend sensor of the present invention utilizes the circuit-conducting technique to realize different bending amplitudes, such that the shortcoming of unidirectional detection in the conventional bend sensor can be successfully resolved. In addition, the present invention can further enhance the detection sensitivity effectively.

While the present invention has been particularly shown and described with reference to a preferred embodiment, it will be understood by those skilled in the art that various changes in form and detail may be without departing from the spirit and scope of the present invention.

What is claimed is:

1. A bend sensor, comprising:
   a flexible circuit substrate, including:
   an insulating body, extending in a first direction;
   a first circuit, disposed on the insulating body, including:
   a first bus portion, disposed at one side of the insulating body, extending in the first direction; and
   a plurality of first fingers, extending from the first bus portion in a second direction different to the first direction; and
   a second circuit, disposed on the insulating body, including:
   a second bus portion, disposed at another side of the insulating body by opposing to the first bus portion, extending in the first direction; and
   a plurality of second fingers, extending from the second bus portion in a reverse direction of the second direction, alternately arranged with the plurality of first fingers;
   an insulation pad, disposed at the insulating body, furnished with a central hollow portion for exposing therefrom the plurality of first fingers and the plurality of second fingers; and
   a flexible conductive substrate, adhered to the insulation pad to sandwich the insulation pad in between with the flexible circuit substrate, furnished with a conductive layer,
   wherein a central empty space is formed mainly at the central hollow portion by having the insulation substrate and the flexible conductive substrate to sandwich the insulation pad, the central empty space has an exhaust pathway to connect spatially the central hollow portion with the atmosphere, and the conductive layer is exposed to the central empty space by facing the plurality of first fingers and the plurality of second fingers with predetermined spacing, and wherein, when the bend sensor is bent at both ends thereof by a bending moment to produce a bending deformation in the first direction, the insulating body and the insulation substrate are bent to enter the central empty space, such that all the plurality of first fingers, the plurality of second fingers and the conductive layer are squeezed toward the central empty space so as to have the conductive layer to contact and conduct with the plurality of first fingers and the plurality of second fingers, the conductive layer thus alters a total contact number of the plurality of first fingers and the plurality of second fingers with the conductive layer according to the bending deformation of the bend sensor, such that an equivalent resistance between the first circuit and the second circuit would vary accordingly, and the bending deformation can thus be realized by detecting the equivalent resistance.

2. The bend sensor of claim 1, wherein the second direction is perpendicular to the first direction.

3. The bend sensor of claim 1, wherein the insulating body has a first end and a second end, and the first end is extended to the second end in the first direction.

4. The bend sensor of claim 3, wherein the first circuit further includes a first transmission portion, the second circuit further includes a second transmission portion, the first transmission portion is formed by extending from the first bus portion to the first end, and the second transmission portion is formed by extending from the second bus portion to the first end.

5. The bend sensor of claim 1, wherein the insulation pad includes:

a first lateral-side supportive portion, disposed at one side of the insulating body, located between the insulating body and the flexible conductive substrate;

a second lateral-side supportive portion, disposed at another side of the insulating body by opposing to the first lateral-side supportive portion, located between the insulating body and the flexible conductive substrate; and an end supportive portion, disposed at one end of the insulating body, integrated as a unique piece with the first lateral-side supportive portion and the second lateral-side supportive portion, such that the first lateral-side supportive portion, the second lateral-side supportive portion and the end supportive portion are integrated to form thereinside the central hollow portion.

6. The bend sensor of claim 5, wherein the first lateral-side supportive portion further has a first end supportive portion, the second lateral-side supportive portion further has a second end supportive portion, and an aperture for communicating spatially the central empty space with the atmosphere is formed between the first end supportive portion and the second end supportive portion at another end of the insulating body by opposing to the end supportive portion.

7. The bend sensor of claim 1, further including a reinforcing plate adhered to the flexible conductive substrate.

* * * * *